United States Patent [19]

Dunlop et al.

[11] Patent Number: 4,838,935

[45] Date of Patent: Jun. 13, 1989

[54] METHOD FOR MAKING TUNGSTEN-TITANIUM SPUTTERING TARGETS AND PRODUCT

[75] Inventors: John A. Dunlop, Veradale, Wash.; Hans Rensing, Rossland, Canada

[73] Assignee: Cominco Ltd., Vancouver, Canada

[21] Appl. No.: 200,344

[22] Filed: May 31, 1988

[51] Int. Cl.$^4$ ............................................. C22C 29/00
[52] U.S. Cl. ..................... 75/230; 204/292; 419/10; 419/48; 419/54; 419/60
[58] Field of Search ....................... 419/10, 48, 54, 60; 75/230; 204/292

[56] References Cited

U.S. PATENT DOCUMENTS

| | | | |
|---|---|---|---|
| 4,331,476 | 5/1982 | Helderman et al. | 419/38 |
| 4,619,695 | 10/1986 | Oikawa et al. | 419/28 |
| 4,663,120 | 5/1987 | Parent et al. | 75/230 |
| 4,731,116 | 3/1988 | Kay | 75/238 |
| 4,750,932 | 6/1988 | Parent et al. | 75/228 |
| 4,770,948 | 9/1988 | Oikawa et al. | 419/28 |

*Primary Examiner*—Stephen J. Lechert, Jr.
*Attorney, Agent, or Firm*—Neil F. Markva

[57] ABSTRACT

Tungsten-titanium sputtering targets with improved characteristics are made from high-purity tungsten powder and a second powder consisting of high-purity titanium hydride powder or high-purity titanium hydride powder and high-purity titanium powder. The second powder contains at least 5%, preferably 25% to 100% by weight of titanium hydride powder. A powder mixture having a binodal particle size distribution with respect to the tungsten and second powders is placed under a containment pressure in a die. The die is heated in a vacuum hot-press chamber to a temperature sufficient to dehydride the titanium hydride, and to remove gases and alkali metals. The die is then heated to a second temperature in the range of 1350° to 1550° C. while maintaining the containment pressure and vacuum. A compaction force in the range of 2000 to 5000 psi is then applied to form a compact. The compaction force and vacuum are subsequently released and the compact is cooled. The compact is easily machined to give a sputtering target having a density of at least 95%, preferably, at least 100% of theoretical density, a total gas content of less than 850 ppm, a carbon content of less than 100 ppm and low particulates upon sputtering.

28 Claims, No Drawings

METHOD FOR MAKING TUNGSTEN-TITANIUM SPUTTERING TARGETS AND PRODUCT

This invention relates to sputtering targets made of tungsten-titanium alloy with improved characteristics and a method for producing such targets. Sputtering targets are used in the fabricating of interconnections between components of micro-electronic integrated circuits for the application of thin layers of the target material onto substrates. For example, alloys of tungsten and titanium, especially 90% W+10% Ti by weight, are used in integrated circuits as a bonding material between gold contacts and silicon substrates. Sputtering targets may be made by a number of methods which may include vacuum casting of molten metal or alloy, and powder metallurgy techniques, such as pressing, compaction, sintering, or hot isostatic pressing, under appropriate conditions. One such method is disclosed in U.S. Pat. No. 4,331,476.

In the manufacture of titanium powder and alloys, and of compacted articles made from powdered metals including titanium, titanium hydride ($TiH_2$) is often used. See, for example, W. E. Kuhn, et al. (Can. Mining Met. Bull., No. 454, 74–87, Feb. 1950) and U.S. Pat. Nos. 3,950,166 and 4,560,621.

The methods for making tungsten-titanium sputtering targets from Ti powder and the methods for making titanium-containing articles from $TiH_2$ powder have a number of disadvantages. Because titanium is a very active metal, it oxidizes readily. Oxide carries over into the target and the oxidized layer on titanium particles is passive during consolidation. Oxides provide a high oxygen content, leave weakly bonded particles during sintering, and create voids. Voids cause a high gas content, a high porosity and a low density, which in turn cause "particulates", i.e., the explosive spilling of particulates and trapped gases into the sputtering chamber during sputtering, resulting in contamination of the layer deposited on the substrate. The method of cold-pressing employing high pressures at low temperatures and the method of high temperature sintering at low pressure can not be used when using $TiH_2$ powder, as these methods result in cracking and high porosity. Hot isostatic pressing is very expensive and does not lend itself for efficient production of shaped articles such as sputtering targets.

We have now discovered that tungsten-titanium sputtering targets of desired configuration and with desired dimensions can be made by using titanium hydride powder or mixtures of titanium powder and titanium hydride powder without the disadvantages experienced with prior art methods. We have also discovered that the characteristics of tungsten titanium sputtering targets made from tungsten and titanium powders are improved when at least a portion of the titanium powder is replaced with titanium hydride power.

More specifically, we have found that sputtering targets with superior characteristics can be efficiently produced when a mixture of tungsten powder and titanium hydride powder, or titanium hydride-titanium mixed powder, having a binodal particle size distribution is added to a die of a desired configuration, heated under vacuum to dehydride the titanium hydride, degassed under vacuum, heated to a temperature in the range of about 1350 to 1550° C., compacted by application of a moderate pressure while maintaining the vacuum and the temperature until full density is attained, and is cooled in a controlled fashion.

The superior characteristics are a higher density, lower porosities and lower carbon and gas contents when compared with the characteristics of commercial targets made with Ti powder. The targets are readily machinable and do not require grinding.

The objects of the present invention are to provide methods for: making tungsten-titanium sputtering targets with improved characteristics; producing tungsten-titanium sputtering targets using titanium hydride; making tungsten-titanium sputtering targets that are easily machinable; and making tungsten-titanium sputtering targets from tungsten and titanium hydride or titanium and titanium hydride powders by hot-pressing under vacuum. It is another object of the present invention to provide tungsten-titanium sputtering targets with improved characteristics. These and other objects of the present invention will be apparent from the following detailed description.

Accordingly, there is provided in a method for the manufacture of tunsten-titanium sputtering targets from tungsten powder and titanium powder, the improvement comprising: replacing at least a portion of the titanium powder with titanium hydride powder. Preferably, the portion of titanium powder replaced with titanium hydride powder is at least about 5% and, most preferably, in the range of about 25 to 100%.

According to a second embodiment of the invention, there is provided a method for the manufacture of a tungsten-titanium sputtering target having improved characteristics and consisting essentially of tungsten and titanium comprising the sequential steps of: (a) providing a heat-resistant pressing die having a cavity with a configuration and dimensions desirable for producing a sputtering target, said die having at least one movable pressing ram adapted for application of axial compaction forces to material in said cavity; (b) mixing tungsten powder and a second powder consisting of at least one material chosen from the group consisting of titanium hydride, and titanium hydride and titanium to form a homogeneous mixture, said second powder containing titanium hydride in an amount sufficient to improve characteristics of said targets; said mixture having a binodal particle size distribution with respect to said tungsten powder and said second powder, and said mixture containing tungsten powder and second powder in amounts sufficient to provide the desired composition of said sputtering target; (c) adding mixture to said cavity in an amount sufficient to yield a compact having substantially the dimensions of said sputtering target; (d) placing said die with added mixture in a vacuum hot-press chamber; (e) applying a containment pressure to said mixture in said die by means of said at least one ram, said containment pressure being sufficient to contain said mixture in said die; (f) evacuating said chamber and said die to a vacuum of at least about $10^{-4}$ torr; (g) heating said die and said mixture in said chamber to a first temperature sufficient to dehydride said titanium hydride and to volatilize alkali metals while maintaining said containment pressure and while continuing said evacuating; (h) maintaining said first temperature for a time sufficient to remove gases and alkali metals substantially from said mixture; (i) heating said die and said mixture in said chamber to a second temperature in the range of about 1350° to 1550° C. while maintaining said containment pressure and said vacuum; (j) applying a compaction force to said mixture at a value in the range of about 2000 to 5000 psi by means of said at least one ram when said second temperature is attained to form a compact of said mixture, said value of said compaction force being dependent on the configuration and dimensions of said sputtering target; (k) maintaining said compaction force under said vacuum and at said second temperature for a time sufficient to effect full compaction of said mixture; (l) releasing said compaction force; (m) releasing said vacuum; (n) slowly cooling said die to a temperature of about 300° C. or less to relieve stress in said compact; (o) removing the cooled compact from said die; and (p) recovering a sputtering target having improved characteristics.

According to a third embodiment of the invention there is provided a sputtering target produced according to the method of the second embodiment.

According to the invention, tungsten-titanium sputtering targets are made from tungsten powder and a second powder consisting of at least one material chosen from titanium hydride powder, and titanium hydride powder and titanium powder. The improvement of the present invention, therefore, exists in the replacing of at least a portion of the titanium powder used in the conventionel manufacture of W-Ti targets with titanium hydride powder.

The replacing of even a small portion of titanium powder, such as, for example, five percent, with titanium hydride powder, improves the characteristics of the targets, especially the oxygen content. Above a content of about 25% of titanium hydride in the second powder, the characteristics become much improved, and the best results are obtained with 100% titanium hydride powder. The portion of titanium powder replaced with titanium hydride powder is, therfore, at least about 5%, preferably in the range of about 25% to 100% by weight, 100% replacement being most preferred.

To obtain a high density of the sputtering target, powdered tungsten and powdered titanium hydride, or titanium hydride powder and titanium powder, are formed into a mixture having a binodal particle size distribution with respect to the tungsten powder and the second powder, and in proportions necessary to yield a target with the desired composition, The preferred composition is 90% tungsten and 10% titanium by weight, but it is understood that targets with other compositions can be made.

High purity (at least 99.99%) tungsten, titanium hydride and titanium powders must be used. In the binodal mixture of powders, the tungsten powder should have particle sizes smaller than about 37 micron and, preferably, smaller than about 20 micron. The preferred tungsten source is a C-10-type powder having a D50 of ten micron and a D80 of eighteen micron. The titanium hydride powder and any titanium/titanium hydride powder should have particle sizes smaller than about 150 micron, for example, a D50 of 75 micron and a D80 of 100 micron. This powder has a gas content lower then that of a finer powder.

The tungsten powder and the titanium hydride powder, or titanium hydride and titanium powders, are mixed in any suitable conventional manner in the desired proportions. To reduce oxidation the mixing operation is preferably carried out in the presence of an inert gas. Compacts are made from powders that have been mixed for at least five minutes and as long as 24 hours to provide homogeneous mixtures and yield targets that have maximum densities.

The mixture is added to a cavity in a heat-resistant pressing die, the cavity being of a configuration and having dimensions such that the configuration of a sputtering target with desired dimensions is produced. Configurations of targets include planar, cylindrical, and annular targets of varying dimensions.

For example, to make annular targets, the die is a hollow graphite cylinder with suficient strength in its wall to contain and withstand pressing forces. The die has at least one pressing ram, preferably two opposing, movable pressing rams, i.e. an upper and a lower ram, made of graphite and movable inside the cylinder to contain the powder mixture and to produce a compact with substantially the configuration and dimensions of the desired sputtering target. The rams are adapted for application of axial compaction forces to the material in the cavity and can be locked in position. The required amount of the mixture is added to the cavity in the die between the rams and the die is placed in the chamber of a vacuum hot-press. The chamber also contains a heater that substantially envelops the die. It will be understood that although the description will proceed with reference to the die having two opposing, movable pressing rams, the die may have a single pressing ram coaxial therewith.

A containment pressure in the range of 100 to 1500 psi is applied with at least one of the rams, the pressure being adequate for containing the mixture in the die during subsequent evacuation. The chamber is subsequently evacuated to a vacuum of at least about $10^{-4}$ torr, preferably in the range of about $10^{-4}$ to $10^{-6}$ torr, by means of a vacuum pump operatively connected to the chamber. The die is then heated at a rate of up to about 20° C./min under the containment pressure, while continuing evacuation, to a temperature sufficient to cause dehydriding of the titanium hydride and volatilization of alkali metals. To achieve this efficiently, heating is continued at this rate to a temperature of about 1100° C., which temperature is maintained for a time sufficient to complete the dehydriding and to effect the removal of gas and any alkali metals from the mixture in the die and from the chamber. During this period, the evacuating is continued.

When dehydriding, and gas and alkali metal removal are complete, the die is further heated at a rate of up to about 20° C./min under vacuum and containment pressure to a second or compaction temperature in the range of about 1350 to 1550° C. The temperature at which compaction is carried out is critical. Below about 1350° C., the compact, i.e. the sputtering target, has a density lower than its optimum. The highest compact density is achieved at the higher end of the temperature range. At temperatures in or above the higher end of the above-recited range, however, the compact becomes subject to carburization that makes it is necessary to bring the compact to its final shape by grinding rather than by machining. Machining is more effective and less expensive. Although temperatures outside the above-recited range can be used the compact is less acceptable. Improved density of the target and good machining of the compact (having minimal depth of carburization) are achieved with an optimum temperature in the range of about 1375° to 1450° C.

When the desired compaction temperature in the range of about 1350° to 1550° C. is reached, the containment pressure is increased by means of at least one of the rams. A compaction force is applied using either one or both rams, while maintaining vacuum. The compaction force has a moderate value that depends on the dimensions and configuration of the sputtering target. For example, for compacts with a large ratio of thickness to surface area, e.g. an annular target, a compaction force of about 5000 round force per square inch of surface area exposed to the compaction force is applied. The force may be applied with one or both rams, with a total applied force of up to about 5000 psi on each surface of the target. For compacts with a plate shape, such as having rectangular, circular, or like cross-sections, and having various thicknesses, a compaction force of about 2000 psi, usually 3000 psi, is applied using the upper ram with the lower ram locked in position.

Generally, a compaction force in the range of about 2000 to 5000 psi is applied while maintaining vacuum and the desired second temperature in the chamber. This combination of conditions is maintained for a time sufficient to effect full compaction of the mixture to maximum density. Full compaction is achieved when position devices attached to the rams indicate that they have ceased to move.

When the rams have ceased to move, compaction is complete and both rams are locked in their final positions. The compaction force is released, the vacuum is released and the die is then cooled slowly to about 300° C. or less, preferably to less than 50° C., to relieve any stress in the compact. Cooling is preferably carried out at a rate in the range of about 20° to 40° C./min with a flow of a noble gas, for example, helium, through the chamber. In this cooling method, the chamber in the hot-press is back-filled with noble gas simultaneously with the releasing of the vacuum.

Alternatively, cooling can be done under vacuum without a gas flow, but cooling times are then much longer. As the system cools, the rams contract from the compact due to differential thermal contraction. The cooled die is removed from the chamber and the compact is recovered and cooled to room temperature. The cooled compact is preferably machined to the dimensions desired for the sputtering target, using ordinary tool bits.

Sputtering targets made according to the present invention have improved characteristics as compared to targets made according to the prior art or targets made with titanium only. These improved characteristics comprise: (1) a low content of contaminants, especially alkali metals; (2) high and uniform apparent, closed porosity and hot-pressed full densities; (3) maximum material utilization; (4) negligible or essentially no surface porosity and total porosity; (5) a low total gas content, especially oxygen, hydrogen and nitrogen; (6) a significantly reduced carbon content; (7) excellent machinabilty; (8) a minimum of waste material, as the die and chamber can be sized closely to the final dimensions of the sputtering target; and (9) low particulates upon sputtering. Preferably, the density is at least 95% of the theoretical density (14.53 g/cm$^3$ for 90 wt. % W+10 wt. % Ti), the porosity is essentially zero, the total gas content is less than about 850 ppm, the oxygen content is less than about 750 ppm and the carbon content is less than about 100 ppm. For cylindrical, disc-shape or flat targets, the density is, preferably, at least equal to 100% of theoretical density. These characteristics are a considerable improvement over those of targets made with titanium powder only.

The invention will now be illustrated by the following nonlimitative examples. In the tests of the following examples, a dual axis, programmable vacuum hot-press was used. The residual gas contents of the compacts or sputtering targets were determined by standard Leco gas analyses. Porosity was determined by scanning electron microscopy, density by application of the Archimedean Principle and hardness by the Rockwell method.

EXAMPLE 1

This example illustrates the manufacture of a tungsten + 10% titanium compact using titanium hydride and tungsten powders an using the method of the invention.

540 g tungsten powder and 52.4 g titanium hydride powder were mixed for one hour in a twin-shell blender, backfilled with argon. The powder mixture, having a weight ratio of nine tungsten to one titanium, was loaded into a graphite die having an inside diameter of 3.2 inches. The 49 pure tungsten powder was a C-10-type powder with a D80 of eighteen micron. The high-purity titanium hydride powder had particle sizes smaller than 150 micron.

The die was placed in the vacuum hot-press chamber and pressure was applied to the upper ram to give a containment pressure on the powder mixture in the die of 1000 psi. The vacuum pump, operatively connected to the chamber, was started and the pressure was reduced to $3.2 \times 10^{-4}$ torr. The die was then heated under continued evacuation at 20° C./min to a temperature of 1100° C. and maintained at that temperature for one hour after which time a vacuum of $2 \times 10^{-4}$ torr was recorded and the removal of gases from the die was completed. The die was then heated at 20° C./min to a final temperature of 1400° C. and pressure on the die was subsequently increased to a compacting force of 3000 psi using the upper ram. The vacuum at the start of compaction was $3.4 \times 10^{-4}$ torr. After 45 minutes, the travel gauges on the rams showed constant values, i.e., the rams were stationary, the vacuum was $9 \times 10^{-5}$ torr, and compaction was completed. Both rams were locked in position, the compaction pressure was released, heaters were switched off and the vacuum was subsequently released while simultaneously back filling the chamber with helium. When atmospheric pressure was attained, a flow of helium at a rate of 15 cfm through the chamber was maintained, cooling the die at a rate of 40° C./min until a final temperature of 300° C. was reached. The door to the chamber was opened to aid in cooling, the gas flow was turned off, and the compact was removed from the die. The time elapsed between the application of the containment pressure and the start of cooling was three hours.

The compact was readily machinable to the final dimensions of a sputtering target. The characteristics of the target were as follows:
density: 14.66 g/cm$^3$ (100.7% of theoretical),
oxygen content: 96 ppm,
nitrogen content: <0.05 ppm,
hydrogen content: 7 ppm, and
carbon content: 39 ppm.

EXAMPLE 2

The physical characteristics of a ring-shaped sputtering target made according to the method of the invention and under conditions similar to those used in Example 1 were compared with those of a W+10Ti ring-shaped sputtering target of the same dimensions and obtained commercially. The characteristics of each of the target are shown in Table I.

TABLE I

| Characteristic | Target Invention | Target Commercial |
| --- | --- | --- |
| Density in g/cm³ | 14.3 | 11.0 |
| % of theoretical density | 96 | 74 |
| Weight in g | 257.7 | 198.3 |

Both targets were used in sputtering a thin film onto three substrates made of glass, ceramic and silicon, respectively, and the film characteristics were measured. The results are shown in Table II.

TABLE II

| Characteristic | Target Invention | Target Commercial |
| --- | --- | --- |
| Thickness in Angstrom | 3300 | 3300 |
| Optical density | >4 | >4 |
| Reflectance | >Commercial | <Invention |
| Adhesion to substrate | good* | good* |
| Resistance per unit of surface in ohm/square** | | |
| ceramic | 5 | 7 |
| glass | 4 | 7 |

*adhesion to each substrate was stronger than the substrate itself.
**ohm/square denotes a unit used in resistivity measurements of thin films.

The results tabulated in Tables I and II show that the target made according to the invention has greater density than commercially available targets resulting in longer target life. Visually observed, there were fewer particulates produced when sputtering using a target according to the invention. The film obtained by sputtering with a target according to the invention has higher reflectance and lower resistance, these attributes represent higher purity, i.e. lower oxide and carbide contents.

EXAMPLE 3

The physical characteristics of a target using only titanium hydride powder and one using only titanium powder, both made according to the invention, and of two commercially-purchased targets were measured and compared. The results are given in Table III.

TABLE III

| Target | Invention W + 10.4% TiH₂ | Invention W + 10% Ti | Commercial W + 10% Ti | Commercial W + 9.1% Ti |
| --- | --- | --- | --- | --- |
| Theoretical Density (Calculated) | 14.5 | 14.5 | 14.5 | 14.9 |
| Apparent Density | 14.9 | 14.9 | 13.5 | 13.8 |
| Closed Porosity Density | 14.9 | 14.9 | 14.2 | 14.2 |
| Full Density | 14.9 | 14.9 | 14.9 | 15.1* |
| Surface Porosity** in % | 0 | 0 | 4.9 | 2.8 |
| Total Porosity*** in % | 0 | 0 | 9.4 | 8.6 |
| Impurity Content in ppm | | | | |
| oxygen | 523 | 2770 | 1743 | 5900 |
| carbon | 28 | 144 | 317 | 277 |
| hydrogen | 112 | 126 | 122 | 0 |
| nitrogen | 13 | 30 | 37 | 416 |
| Hardness Rockwell | 50 | 50 | 40 | 54 |
| Machinability | good | fair | good | not machinable |

*This density was obtained by subjecting the commercial target to an additional hot-pressing at 1500° C. and under 3000 psi.

**Surface Porosity = $\frac{(\text{density at closed porosity} - \text{apparent density}) \times 100}{\text{closed porosity density}}$

***Total Porosity = $\frac{(\text{hot pressed density} - \text{apparent density}) \times 100}{\text{hot pressed full density}}$ The tabulated data show that the targets made according to the invention with titanium hydride powder or titanium powder have a consistently higher density than commercially available targets made with titanium powder and have essentially zero porosities, while commercially available targets have porosities of several percent. The target made with titanium hydride has a much lower oxygen, carbon and total gas contents than any of the targets made with titanium powder only.

EXAMPLE 4

This example illustrates that sputtering targets with improved characteristics can be made with high-purity tungsten powder, and high-purity titanium hydride powder or high-purity titanium powder or mixtures thereof, by using the method of the invention. The characteristics of the powders are given in Table IV.

TABLE IV

| Powder | Purity in % | Carbon in ppm | Oxygen in ppm |
| --- | --- | --- | --- |
| W | 99.99 | 25 | 482 |
| TiH₂ | 99.99 | 70 | 1560 |
| Ti | 99.99 | 131 | 5250 |

Tungsten powder was mixed with titanium hydride powder, or titanium powder, or titanium and titanium hydride powders in varying amounts to yield W + 10% Ti compacts. Using the mixing and compaction methods as described in Example 1, compacts were produced at varying compaction temperatures, with other conditions being the same as or similar to those described in Example 1. The targets were analyzed and characteristics determined. The results are given in Table V.

TABLE V

| Compact No. | Ti % | TiH₂ % | Temp. °C. | Density g/cm³ | Density % of theor. | Oxygen ppm | Carbon ppm |
| --- | --- | --- | --- | --- | --- | --- | --- |
| 1 | 100 | 0 | 1200 | 13.92 | 96 | 991 | 34 |
| 2 | 75 | 25 | 1400 | 14.68 | 101 | 977 | 29 |
| 3 | 50 | 50 | 1400 | 14.71 | 101 | 924 | 28 |
| 4 | 0 | 100 | 1200 | 13.78 | 95 | 791 | 16 |
| 5 | 0 | 100 | 1550 | 14.87 | 102 | 800 | 35 |

Analyses for alkali metals (Na, K, Li) showed that the alkali metal content of the powder mixtures before compaction ranged from 2 to 15 ppm and of the compacts was from 0.5 to "not detectable".

The compacts made at 1200° and 1400° C. were easily machinable, but the compact made at 1550° C. was difficult to machine.

The results show that increasing amounts of titanium hydride powder yield compacts with decreasing oxygen and carbon contents, the carbon content increasing with temperature, that compacting temperatures of 1400° and 1550° C. give densities higher than theoretical, that a compacting temperature of 1200° C. yields only 95% of theoretical density, that the alkali metal contents of the compacts is negligible, and that the machinability of compacts made at temperatures up to 1550° C. is excellent.

EXAMPLE 5

Using the method according to the invention, a plate-type compact (W+10% Ti) was made at 1400° C. and under 3000psi, and its density and machinability compared with annular compacts (W+10% Ti) made under 3000 and 5000 psi compaction forces, respectively, and at 1400° and 1600° C. compaction temperatures. The densities and machinability of the compacts are given in Table VI.

TABLE VI

| Compact Type | Compaction Force psi | Temp. °C. | Density g/cm³ | % of theo. | Machinability |
|---|---|---|---|---|---|
| 5 × 15" plate | 3000 | 1400 | 14.6 | 100 | very good |
| 3" plate | 3000 | 1400 | 14.7 | 101 | very good |
| 3" ring | 3000 | 1400 | 14.3 | 98 | very good |
| 3" ring | 3000 | 1600 | 13.7 | 94 | poor-abrasive |
| 3" ring | 5000 | 1400 | 14.4 | 99 | very good |

The results show that compaction temperatures of 1400° C. yield compacts that have very good machinability and that the machinability is poor at 1600° C.. The results also show that the plate-type compacts have a density at least equal to theoretical and that the annular compacts have densities below theoretical. The lower densities of annular compacts occur because the area of an annular compact in contact with the die is much greater than the area in contact with the rams, which results in a large loss of force to the walls of the die. Increased compaction force only partially compensates the force lost to the die walls.

It is understood that modifications may be made in the method of the invention without departing from the scope of the appended claims.

We claim:

1. In a method for the manufacture of tungsten-titanium sputtering targets from tungsten powder and titanium powder, the improvement comprising replacing at least a portion of the titanium powder with titanium hydride powder.

2. The improvement as claimed in claim 1, wherein the portion of titanium powder replaced with titanium hydride powder is at least about 5% by weight.

3. The improvement as claimed in claim 1, wherein the portion of titanium powder replaced with titanium hydride powder is in the range of about 25 to 100% by weight.

4. A method for the manufacture of a sputtering target having improved characteristics and consisting essentially of tungsten and titanium comprising the sequential steps of:
   (a) providing a heat-resistant pressing die having a cavity with a configuration and dimensions desirable for producing a sputtering target, said die having at least one movable pressing ram adapted for application of axial compaction forces to material in said cavity;
   (b) mixing tungsten powder and a second powder consisting of at least one material chosen from the group consisting of titanium hydride and titanium hydride and titanium to form a homogeneous mixture, said second powder containing titanium hydride in an amount sufficient to improve characteristics of said target; said mixture having a binodal particle size distribution with respect to said tungsten powder and said second powder, and said mixture containing tungsten powder and second powder in amounts sufficient to provide the desired composition of said sputtering target;
   (c) adding mixture to said cavity in an amount sufficient to yield a compact having substantially the dimensions of said sputtering target;
   (d) placing said die with added mixture in a vacuum hot-press chamber;
   (e) applying a containment pressure to said mixture in said die by means of said at least one ram, said containment pressure being sufficient to contain said mixture in said die;
   (f) evacuating said chamber and said die to a vacuum of at least about $10^{-4}$ torr;
   (g) heating said die and said mixture in said chamber to a first temperature sufficient to dehydride said titanium hydride and to volatilize alkali metals while maintaining said containment pressure and while continuing said evacuating;
   (h) maintaining said first temperature for a time sufficient to remove gases and any alkali metals substantially from said mixture;
   (i) heating said die and said mixture in said chamber to a second temperature in the range of about 1350° to 1550° C. while maintaining said containment pressure and said vacuum;
   (j) applying a compaction force to said mixture at a value in the range of about 2000 to 5000 psi by means of said at least one ram when said second temperature is attained to form a compact of said mixture, said value of said compaction force being dependent on the configuration and dimensions of said sputtering target;
   (k) maintaining said compaction force under said vacuum and at said second temperature for a time sufficient to effect full compaction of said mixture;
   (l) releasing said compaction force;
   (m) releasing said vacuum;
   (n) slowly cooling said die to a temperature of about 300° C. or less to relieve stress in said compact;
   (o) removing the cooled compact from said die;
   (p) recovering a sputtering target having improved characteristics.

5. A method as claimed in claim 4, wherein said tungsten powder has particle sizes smaller than about 37 micron.

6. A method as claimed in claim 4, wherein said second powder has particle sizes smaller than about 150 micron.

7. A method as claimed in claim 4, wherein said second powder contains titanium hydride powder in an amount of at least about 5% by weight.

8. A method as claimed in claim 4, wherein said second powder contains titanium hydride powder in an amount in the range of about 25% to 100% by weight.

9. A method as claimed in claim 4, wherein said mixing is done under an inert gas.

10. A method as claimed in claim 4, wherein the containment pressure in step (e) is in the range of about 1000 to 1500 psi.

11. A method as claimed in claim 4, wherein, in step (g), the die is heated at a rate of up to about 20° C./min to a first temperature of about 1100° C. while maintaining said containment pressure and a vacuum in the range of about $10^{-4}$ to $10^{-6}$ torr.

12. A method as claimed in claim 4, wherein, in step (i), the die is heated at a rate of up to about 20° C./min to a second temperature in the range of about 1375 to 1450° C. while maintaining said containment pressure and a vacuum in the range of about $10^{-4}$ to $10^{-6}$ torr.

13. A method as claimed in claim 4, wherein said vacuum is released after releasing said compaction force, while simultaneously backfilling said chamber with a noble gas and maintaining a flow of noble gas through said chamber during said cooling, said flow being sufficient to cool said die at a rate in the range of about 20 to 40°/min.

14. A method as claimed in claim 13, wherein said noble gas is helium.

15. A method as claimed in claim 4, wherein said sputtering target consists essentially of 90% tungsten and 10% titanium by weight.

16. A method as claimed in claim 4, wherein said improved characteristics of the recovered sputtering target comprise a density of at least about 95% of theoretical density, essentially no porosity, a total gas content of less than about 850 ppm, a carbon content of less than about 100 ppm and reduced particulates during sputtering.

17. A method as claimed in claim 16, wherein said density is at least equal to the theoretical density.

18. A method as claimed in claim 4, wherein said die has two opposing movable pressing rams.

19. A method as claimed in claim 4, wherein said cooled compact having substantially the dimensions of said sputtering target is machined to the desired dimensions.

20. A method for the manufacture of a sputtering target having predetermined configuration and dimensions and having improved characteristics, and consisting essentially of tungsten and titanium comprising the sequential steps of:
  (a) mixing an amount of high purity tungsten powder, having a particle size distribution of the C-10-type with a D50 of about ten micron and a D80 of bout eighteen micron, with an amount of a second powder having particle sizes smaller than about 150 micron to form a mixture, said second powder consisting of at least one material chosen from the group consisting of high purity titanium hydride powder, and high purity titanium hydride powder and high purity titanium powder, said second powder containing titanium hydride powder in an amount in the range of about 25 to 100% by weight, said amount of tungsten powder and said amount of second powder being sufficient to provide a sputtering target of the desired composition,
  (b) adding an amount of said mixture to a cavity in a graphite die, said die having an upper movable, lockable, graphite ram and a lower movable, lockable, graphite ram adapted for application of axial compaction forces to said mixture in said cavity on opposite sides thereof and said die having the configuration and substantially the desired dimensions of the sputtering target, said amount of mixture being sufficient to provide a compact of substantially said desired composition and said desired dimensions upon compaction;
  (c) placing said die with added mixture in a chamber adapted for evacuation and heating;
  (d) applying a containment pressure at a value in the range of about 100 to 1500 psi to said mixture in said die by means of moving at least one of said rams;
  (e) evacuating said chamber and said die to a vacuum in the range of about $10^{-4}$ to $10^{-6}$ torr;
  (f) heating said die with added mixture in said chamber at a rate of up to about 20° C./min to a first temperature of about 1100° C. while maintaining said containment pressure and continuing said evacuating;
  (g) maintaining said die with added mixture at said first temperature for a time sufficient to remove gases and any alkali metals substantially from said mixture while maintaining said containment pressure and continuing said evacuating;
  (h) heating said die with added mixture at a rate of up to about 20° C./min to a second temperature in the range of about 1375° to 1450° C. while maintaining said containment pressure and maintaining said vacuum in the range of about $10^{-4}$ to $10^{-6}$ torr;
  (i) applying a compaction force to said mixture by applying increased axial forces by means of moving at least one of said rams, said compaction force having a value in the range of about 2000 to 5000 psi to form a compact of said mixture, said value of the compaction force being dependent on the configuration and dimensions of said sputtering target;
  (j) maintaining said compaction force, said second temperature and said vacuum until no movement of the rams is observed and full compaction of said mixture is effected;
  (k) locking said rams in position;
  (l) releasing said compaction force;
  (m) releasing said vacuum and simultaneously backfilling said chamber with helium;
  (n) cooling said die and said compact to a temperature of about 50° C. at a rate in the range of about 20° to 40° C./min by maintaining a flow of helium through said chamber;
  (o) removing the cooled compact from the die;
  (p) machining said compact having substantially the dimensions of said sputtering target to said desired dimensions; and
  (q) recovering a sputtering target of said desired dimensions and having a density of at least about 95% of theoretical density, a combined gas content of oxygen, hydrogen and nitrogen of less than about 850 ppm, a carbon content of less than about 100 ppm, essentially no porosity and low particulates upon sputtering.

21. A method as claimed in claim 20, wherein said sputtering target consists essentially of 90% tungsten and 10% titanium by weight.

22. A method as claimed in claim 20, wherein said second powder consists essentially of 100% by weight of titanium hydride powder.

23. A tungsten-titanium sputtering target made by the method of claim 4.

24. A tungsten-titanium sputtering target made by the method of claim 15.

25. A tungsten-titanium sputtering target made by the method of claim 16.

26. A tungsten-titanium sputtering target made by the method of claim 20.

27. A tungsten-titanium sputtering target made by the method of claim 21.

28. A tungsten-titanium sputtering target made by the method of claim 22.

* * * * *